(12) United States Patent
Bremensdorfer et al.

(10) Patent No.: US 11,521,868 B2
(45) Date of Patent: Dec. 6, 2022

(54) SUPPORT PLATE FOR LOCALIZED HEATING IN THERMAL PROCESSING SYSTEMS

(71) Applicants: Mattson Technology, Inc., Fremont, CA (US); Beijing E-Town Semiconductor Technology Co., Ltd., Beijing (CN)

(72) Inventors: Rolf Bremensdorfer, Bibertal (DE); Johannes Keppler, Palo Alto, CA (US); Michael X. Yang, Palo Alto, CA (US); Thorsten Hülsmann, Dornstadt (DE)

(73) Assignees: BEIJING E-TOWN SEMICONDUCTOR TECHNOLOGY, CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 852 days.

(21) Appl. No.: 16/356,074

(22) Filed: Mar. 18, 2019

(65) Prior Publication Data
US 2019/0295869 A1 Sep. 26, 2019

Related U.S. Application Data

(60) Provisional application No. 62/645,476, filed on Mar. 20, 2018.

(51) Int. Cl.
*H01L 21/67* (2006.01)
*H01L 21/324* (2006.01)
*H01L 21/687* (2006.01)

(52) U.S. Cl.
CPC ...... *H01L 21/67115* (2013.01); *H01L 21/324* (2013.01); *H01L 21/6875* (2013.01); *H01L 21/68757* (2013.01)

(58) Field of Classification Search
None
See application file for complete search history.

(56) References Cited

U.S. PATENT DOCUMENTS 6,449,428 B2 * 9/2002 Aschner ............... C30B 25/12
219/390
7,045,746 B2 5/2006 Devine et al.
(Continued)

FOREIGN PATENT DOCUMENTS

DE 102011100055 10/2012
DE 102011100055 A1 * 10/2012 ........ H01L 21/67115
(Continued)

OTHER PUBLICATIONS

English translation of JP-2018032758-A (Year: 2018).*
(Continued)

*Primary Examiner* — Michael G Hoang
*Assistant Examiner* — Kurt J Wolford
(74) *Attorney, Agent, or Firm* — Dority & Manning, P.A.

(57) ABSTRACT

Support plates for localized heating in thermal processing systems to uniformly heat workpieces are provided. In one example implementation, localized heating is achieved by modifying a heat transmittance of a support plate such that one or more portions of the support plate proximate the areas that cause cold spots transmit more heat than the rest of the support plate. For example, the one or more portions (e.g., areas proximate to one or more support pins) of the support plate have a higher heat transmittance (e.g., a higher optical transmission) than the rest of the support plate. In another example implementation, localized heating is achieved by heating a workpiece via a coherent light source through a transmissive support structure (e.g., one or more support pins, or a ring support) in addition to heating the workpiece globally by light from heat sources.

10 Claims, 9 Drawing Sheets

(56) References Cited

U.S. PATENT DOCUMENTS

| | | | |
|---|---|---|---|
| 7,616,872 | B2 | 11/2009 | Camm et al. |
| 7,949,237 | B2 * | 5/2011 | Koren ............... H01L 21/67115 |
| | | | 118/724 |
| 7,977,258 | B2 | 7/2011 | Nenyei et al. |
| 8,434,341 | B2 | 5/2013 | Camm et al. |
| 8,454,356 | B2 | 6/2013 | Camm et al. |
| 9,482,468 | B2 | 11/2016 | Camm et al. |
| 9,627,244 | B2 | 4/2017 | Camm et al. |
| 2013/0248504 | A1 * | 9/2013 | Kusuda ............. H01L 21/67115 |
| | | | 219/121.85 |
| 2014/0105582 | A1 | 4/2014 | Tallavarjula et al. |
| 2014/0113458 | A1 | 4/2014 | Pan et al. |
| 2016/0351424 | A1 * | 12/2016 | Fuse ....................... F27D 11/12 |
| 2017/0076965 | A1 | 3/2017 | Lee et al. |
| 2017/0103907 | A1 * | 4/2017 | Chu .................. H01L 21/67115 |
| 2017/0243771 | A1 | 8/2017 | Abe |

FOREIGN PATENT DOCUMENTS

| | | | | |
|---|---|---|---|---|
| JP | H1097999 | A * | 4/1998 | ........... H01L 21/205 |
| JP | 2015018909 | A | 1/2015 | |
| JP | 2016225429 | | 12/2016 | |
| JP | 2018032758 | | 3/2018 | |
| JP | 2018032758 | A * | 3/2018 | ............. H01L 21/26 |

OTHER PUBLICATIONS

English translation of DE-102011100055-A1 (Year: 2012).*
English translation of JP H1097999 A (Year: 1998).*
PCT International Search Report and Written Opinion for corresponding PCT Application No. PCT/US2019/022681, dated Jun. 28, 2019, 12 pages.

* cited by examiner

SUPPORT PLATE FOR LOCALIZED HEATING IN THERMAL PROCESSING SYSTEMS

PRIORITY CLAIM

The present application claims the benefit of priority of U.S. Provisional Application Ser. No. 62/645,476, titled "SUPPORT PLATE FOR LOCALIZED HEATING IN THERMAL PROCESSING SYSTEMS," filed on Mar. 20, 2018, the entirety of which is incorporated herein by reference for all purposes.

FIELD

The present disclosure relates generally to thermal processing systems.

BACKGROUND

A thermal processing chamber as used herein refers to a device that heats workpieces, such as semiconductor wafers. Such devices can include a support plate for supporting one or more semiconductor wafers and an energy source for heating the semiconductor wafers, such as heating lamps, lasers, or other heat sources. During heat treatment, the semiconductor wafers can be heated under controlled conditions according to a preset temperature regime.

Many semiconductor heating processes require a wafer to be heated to high temperatures so that various chemical and physical transformations can take place as the wafer is fabricated into a device(s). During rapid thermal processing, for instance, semiconductor wafers can be heated by an array of lamps through the support plate to temperatures from about 300° C. to about 1,200° C., for times that are typically less than a few minutes. During these processes, a primary goal can be to heat the wafers as uniformly as possible.

SUMMARY

Aspects and advantages of embodiments of the present disclosure will be set forth in part in the following description, or may be learned from the description, or may be learned through practice of the embodiments.

One example aspect of the present disclosure is directed to a thermal processing apparatus. The apparatus includes a plurality of heat sources configured to heat a workpiece. The apparatus includes a rotatable support plate operable to support the workpiece during thermal processing. The rotatable support plate includes a transmissive support structure configured to contact the workpiece. The transmissive support structure includes a first end and a second end. The first end of the support structure is arranged to support the workpiece. The apparatus includes a light source operable to emit coherent light through the transmissive support structure such that the coherent light heats a portion of the workpiece contacting the transmissive support structure.

Other example aspects of the present disclosure are directed to systems, methods, devices, and processes for thermally treating a semiconductor substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
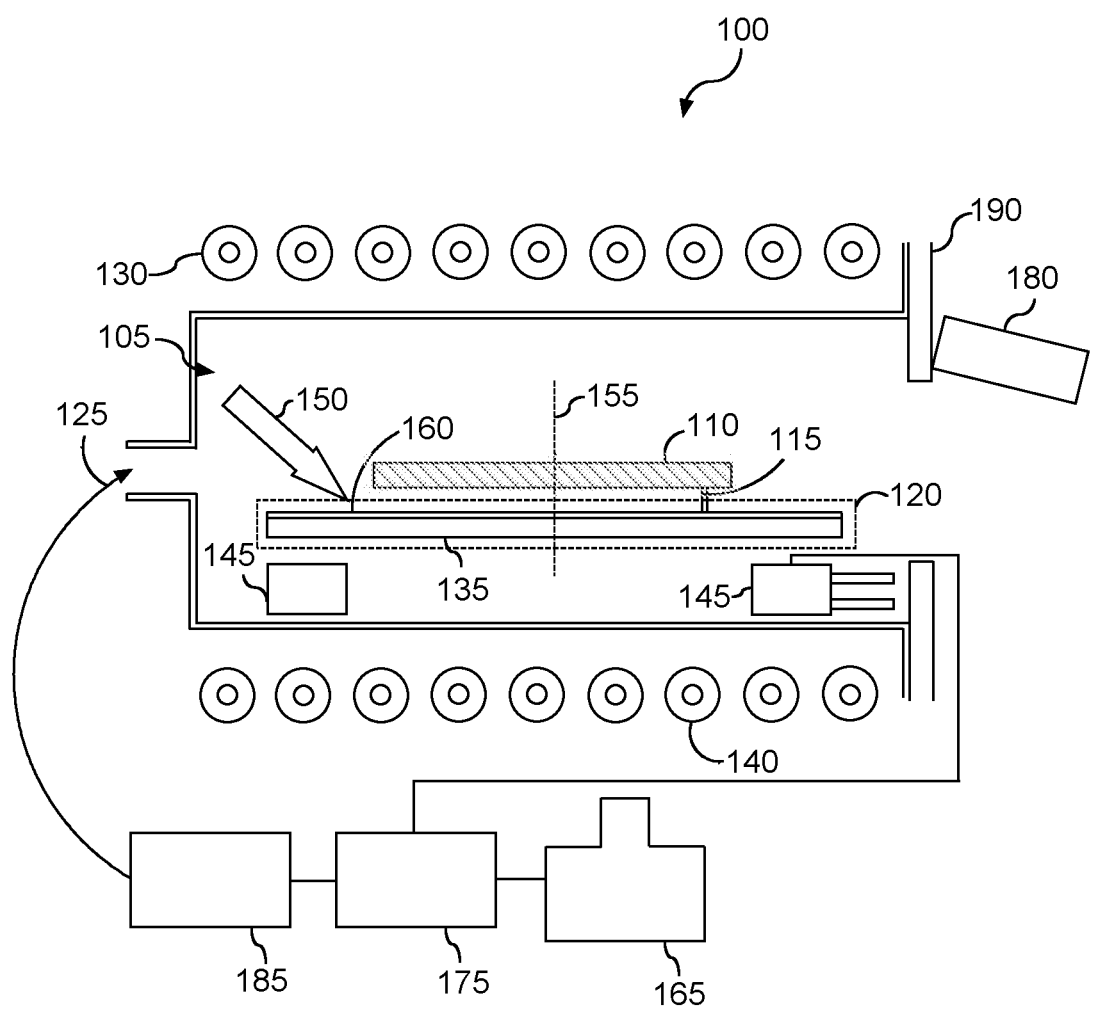
FIG. 1 depicts an example rapid thermal processing (RTP) system having a support plate with spatially arranged low transmission zones according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to support plates for localized heating in thermal processing systems to uniformly heat workpieces, such as semiconductor workpieces, opto-electronic workpieces, flat panel displays, or other suitable workpieces. The workpiece materials can include, for instance, silicon, silicon germanium, glass, plastic, or other suitable material. In some embodiments, the workpieces can be semiconductor wafers. The support plates can be used to support workpieces in various thermal processing systems that implement a variety of workpiece manufacturing processes, including, but not limited to vacuum anneal processes, rapid thermal processes, etc. The support plates can be applied to the above thermal processing systems where one side (e.g., a backside) or both sides of the workpiece are exposed to one or more heat sources.

A thermal processing chamber can include a heat source to emit light ranging from an ultraviolet to a near infrared electromagnetic spectrum. In order to expose one side or both sides of a workpiece to the heat source, the workpiece is supported by one or more support pins mounted onto a carrier structure, typically a base below the workpiece. The support pins and the base form a support plate. In some configurations, the base is made from a highly transparent, uniform material (e.g., quartz glass) as to not obstruct light from the heat sources. However, obstruction of light by the support pins cannot be avoided. As such, there can be a pin spot effect reducing the workpiece temperature at contact areas of the workpiece in contact with the support pins.

During heating the workpiece, the workpiece is not in thermal equilibrium with walls and the support plate in the thermal processing chamber. Even though a thermal conduction of a material (e.g., a quartz material) of a support pin is low and a contact area of the workpiece in contact with the support pin is small, there is still a cooling effect by the thermal conduction into the colder contact area associated with the support pin. Additionally, in fast thermal transients (e.g., rapid thermal processing applications), added thermal mass of a support pin can cause a reduced heat up rate of the workpiece at the contact area. As a result, the workpiece temperature is reduced at the contact area forming a cold spot. Typically, one or more cold spots can be left at one or more contact areas of the workpiece in contact with the support plate. The cold spots can be caused by three main effects, such as shadowing, thermal conduction and higher thermal mass. According to example aspects of the present disclosure, localized heating of the contact areas can be used to compensate the cold spots left on the workpiece.

An example aspect of the present disclosure is directed to a support plate for localized heating in a thermal processing system to compensate cold spots on a workpiece. Localized heating is achieved by modifying a heat transmittance of a support plate such that one or more portions of the support plate proximate the areas that cause cold spots transmit more heat than the rest of the support plate.

For example, the support plate can include a base and one or more support pins for contacting a workpiece during processing. One or more heat sources (e.g., lamp, laser, or other heat sources) are used to heat the workpiece. Localized heating is achieved by modifying an optical transmittance of the support plate such that the areas of the support plate proximate (e.g., under and/or around, above and/or around, etc.) to the support pins transmit more light from the heat sources than the rest of the support plate. For example, the optical transmittance of the support plate is modified such that only portions of the base where the support pins are joined to the base are unchanged with respect to untreated material (e.g., quartz glass) of the base. In portions of the base away from the support pins, the optical transmittance is reduced by treatment of the quartz glass of the base. The treatment to reduce the optical transmittance can include grinding, coating, engraving, or doping. The portions of the base with untreated quartz glass transmit a higher heating flux relative to the portions of the base with treated quartz glass. As such, the workpiece is exposed to a higher heating flux from the portions of the base located proximate to the support pins, resulting in a compensation of cold spots caused by the support pins.

Another example aspect of the present disclosure is directed to a thermal processing apparatus for localized heating in thermal processing systems to compensate cold spots on the workpiece. The thermal processing apparatus includes one or more heat sources (e.g., lamps, or any other heat sources), a coherent light source (e.g., a laser, or any other suitable source), and a rotatable support plate having a support structure (e.g., one or more support pins, or a ring support, etc.). Cold spots resulting from contact of the workpiece with the support structure can be compensated by heating the workpiece via the coherent light source through the support structure in addition to heating the workpiece globally by light from the heat sources. As such, the cold spots are heated locally by light from the coherent light source.

For example, in some embodiments, a cold spot is compensated by shining a beam of the coherent light (e.g., a laser beam) from the coherent light source onto a support pin. The support pin is made from a transmissive material, such as quartz. The coherent light passes through the transmissive support pin to heat the portion of the workpiece contacting the support pin.

In some embodiments, the coherent light source is mounted to a stationary part of the thermal processing apparatus such that the support pin is rotating through the coherent light during rotation of the support plate. The coherent light source, in some embodiments, can be controlled to be switched on and off synchronized to the workpiece rotation as to only heat a contact area of the workpiece in contact with the support pin. For instance, the coherent light source can be controlled only to emit coherent light when the support pin passes in front of the coherent light source during rotation of the support plate.

In some embodiment, the synchronization can be accomplished by shaping the power of the coherent light emitted from the light source. For instance, the power of the coherent light can be controlled to be at a first value when the support pin is not passing in front of the coherent light source. As the support pin approaches the coherent light source, the power of the coherent light can be increased. When the support pin passes through the coherent light source, the power of the coherent light can be controlled to be at a second value that is greater than the first value. As the support pin rotates away from the coherent light source, the power of the coherent light can be decreased, for instance, back to the first value or to a third value that is less than the second value.

In some embodiments, this synchronization can be accomplished by an electrical control circuit, where a trigger signal is generated from a sensor signal indicative of a rotation orientation and a rotation speed. For example, based on known information of the rotation orientation and the speed of the rotatable support plate or of the workpiece, an emission of the coherent light source can be synchronized with a motion of the rotatable support plate. The coherent light source emits coherent light into the support pin and onto the workpiece when the support pin passes over the coherent light source during rotation of the support plate, and the coherent light source stops emitting the coherent light when the support pin is not located in front of the coherent light source.

In some embodiments, localized heating can be achieved by modifying an optical transmission of the base such that one or more portions of the base that are proximate to the support pins transmit the coherent light and the rest of the base is opaque to the coherent light from the coherent light source. The opaque portions of the base can be generated by grinding, coating, engraving, or doping. The opaque portions of the base can be small as to not obstruct light from the heat sources. In some embodiments, an opaque portion is a wavelength selective coating on one side (e.g., a backside) or both sides of the base in form of a semi-annular opaque portion (e.g., a segmented ring). The semi-annular opaque portions can extend between support pins along a path of coherent light along the base during rotation of the support plate relative to the coherent light source.

In some embodiments. a width of the semi-annual opaque portion can be less than or equal to a diameter of a contact area of the coherent light in contact with the base. Examples of the contract area include a focal point of the coherent light onto the base, or a cross-section of the coherent light in contact with the base. The wavelength sensitive coating is selected such that only a narrow band of the coherent light radiation is blocked, whereas a broad band light from the heat sources is almost completely transmitted, reducing an effect on a global temperature uniformity. As such, the synchronization of the coherent light source to the rotatable support plate's rotation is inherently brought about by the rotatable support plate itself. In this example embodiment, the coherent light source can remain on and emit coherent light during an entire heat cycle or relevant portions of the heat cycle.

In some embodiments, the support plate can include a ring support. The ring support can be a transmissive material (e.g., quartz) that allows the passage of coherent light from the coherent light source to heat the workpiece. In this example embodiment, the coherent light source can remain on and emit coherent light during an entire heat cycle or relevant portions of the heat cycle. The ring support can be mounted to the base centered with respect to a center of the workpiece. A height of the ring support can be approximately the same as a height of a support pin. Without additional heating, the ring support can cause a rotational symmetric cold pattern on the workpiece. By placing the coherent light source proximate to (e.g., below) the ring support, and by rotating the workpiece and the ring support about its common center, the cold pattern is compensated by a continuously emitting coherent light from the coherent light source through the ring support onto the workpiece.

Aspects of the present disclosure can achieve a number of technical effects and benefits. For instance, aspects of the present disclosure can reduce the presence of cold spots associated with support pins in thermal processing tools.

Variations and modifications can be made to these example embodiments of the present disclosure. As used in the specification, the singular forms "a," "and," and "the" include plural referents unless the context clearly dictates otherwise. The use of "first," "second," "third," and "fourth" are used as identifiers and are directed to an order of processing. Example aspects may be discussed with reference to a "substrate," "wafer," or "workpiece" for purposes of illustration and discussion. Those of ordinary skill in the art, using the disclosures provided herein, will understand that example aspects of the present disclosure can be used with any suitable workpiece. The use of the term "about" in conjunction with a numerical value refers to within 20% of the stated numerical value.

With reference now to the FIGS., example embodiments of the present disclosure will now be discussed in detail. FIG. 1 depicts an example rapid thermal processing (RTP) system 100 having a support plate 120 with spatially arranged low transmission zones according to example embodiments of the present disclosure. As illustrated, the RTP system 100 includes a RTP chamber 105, a workpiece 110, a support plate 120, heat sources 130 and 140, air bearings 145, a pyrometer 165, a controller 175, a door 180, and a gas flow controller 185.

The workpiece 110 to be processed is supported in the RTP chamber 105 (e.g., a quartz RTP chamber) by the support plate 120. The support plate 120 supports the workpiece 110 during thermal processing. The support plate 120 includes a rotatable base 135 and at least one support structure 115 extending from the rotatable base 135. A support structure describes a structure contacting and supporting a workpiece during thermal processing. Examples of the support structure can include one or more support pins, a ring support, or any other suitable support that contacts and supports a workpiece. As shown in FIG. 1, the support structure 115 includes one or more support pins (only one shown). The support structure 115 and the rotatable base 135 can transmit heat from the heat sources 140 and to absorb heat from the workpiece 110. In some embodiments, the support structure 115 and the rotatable base 135 can be made of quartz. The rotatable base 135 rotates the workpiece 110 at a defined rotation orientation and at a defined rotation speed, as further described below.

A guard ring (not shown) can be used to lessen edge effects of radiation from one or more edges of the workpiece 110. An end plate 190 seals to the chamber 105, and the door 180 allows entry of the workpiece 110 and, when closed, allows the chamber 105 to be sealed and a process gas 125 to be introduced into the chamber 105. Two banks of heat sources (e.g., lamps, or other suitable heat sources) 130 and 140 are shown on either side of the workpiece 110. The controller 175 (e.g., a computer, microcontroller(s), other control device(s), etc.) is used to control the heat sources 130 and 140. The controller 175 can be used to control the gas flow controller 185, the door 180, and/or the temperature measuring system, denoted here as the pyrometer 165.

A gas flow 150 can be an inert gas that does not react with the workpiece 110, or the gas flow 150 can be a reactive gas such as oxygen or nitrogen that reacts with the material of the workpiece 110 (e.g. a semiconductor wafer, etc.) to form a layer of on the workpiece 110. The gas flow 150 can be a gas that can contain a silicon compound that reacts at a heated surface of the workpiece 110 being processed to form a layer on the heated surface without consuming any material from the surface of the workpiece 110. When the gas flow 150 reacts to form a layer on the surface, the process is called rapid thermal-chemical vapor deposition (RT-CVD). In some embodiments, an electrical current can be run through the atmosphere in the RTP system 100 to produce ions that are reactive with or at the surface, and to impart extra energy to the surface by bombarding the surface with energetic ions.

The controller 175 controls the rotatable base 135 to rotate the workpiece 110. For example, the controller 175 generates an instruction that defines the rotation orientation and the rotation speed of the rotatable base 135, and controls the rotatable base 135 to rotate the workpiece 110 with the defined rotation orientation and the defined rotation speed. The rotatable base 135 is supported by the air bearings 145. The gas flow 150 impinging on the rotatable base 135 causes the rotatable base 135 to rotate about an axis 155.

In some embodiments, the rotatable base 135 can have a first portion associated with a first heat transmittance and a second portion associated with a second heat transmittance. The second heat transmittance is different from the first heat transmittance. The second portion is located proximate to the support pins 115. Examples of the rotatable base 135 are further described below in conjunction with FIGS. 2A and 2B.

Figure 2A:
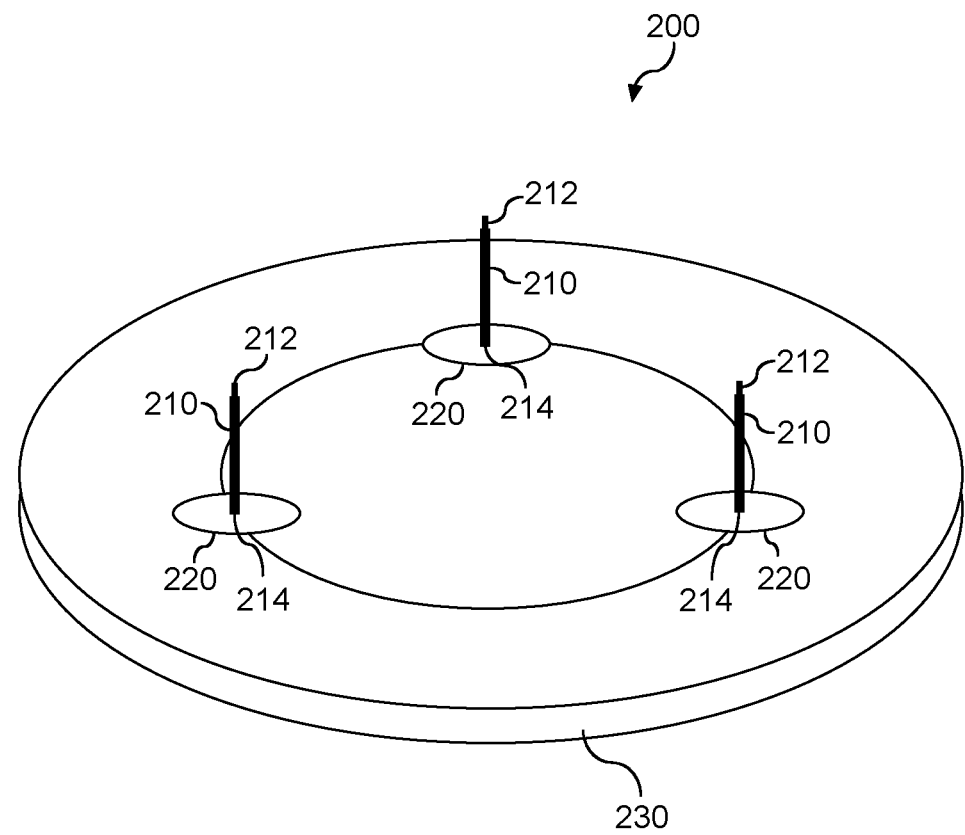
FIGS. 2A and 2B depict an example support plate with spatially arranged low transmission zones according to example embodiments of the present disclosure.
Figure 2B:
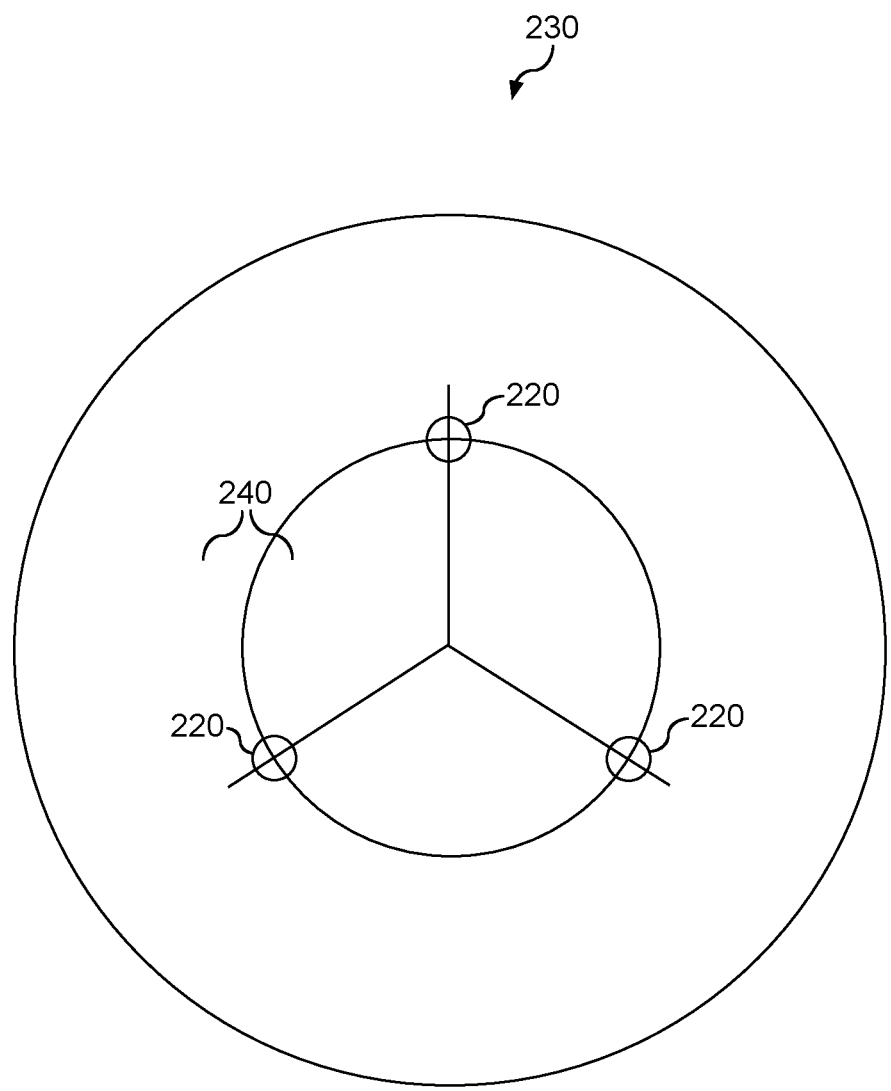

FIGS. 2A and 2B depict an example support plate 200 with spatially arranged low transmission zones according to example embodiments of the present disclosure. In the embodiments of FIGS. 2A and 2B, the support plate 200 includes three support pins 210 and a rotatable base 230.

More or fewer support pins can be used without deviating from the scope of the present disclosure.

In some embodiments, the support plate 200 is an example embodiment of the support plate 120 (FIG. 1), and one support pin 210 is an embodiment of example support pin 115 (FIG. 1). Each support pin 210 has a first end 212 and a second end 214. The first end 212 of the support pin 210 contacts and supports a workpiece (not shown). The second end 214 of the support pin 210 contacts (e.g., is coupled to) the rotatable base 230. In some embodiments, the support pin(s) 210 can be integral with the rotatable base 230.

As shown, the rotatable base 230 includes three circular areas 220. Each circular area 220 is located proximate to the second end 214 of one support pin 210. A diameter of one circular area 220 is greater than a diameter of a contact area of a corresponding support pin 210 contacting the rotatable base 230. A center of one circular area 220 coincides with a center of a corresponding support pin 210. Remaining areas 240 of the rotatable base 230 describe areas that exclude the three circular areas 220 within the rotatable base 230. The remaining areas 240 are associated with a first heat transmittance, and the three circular areas 220 are associated with a second heat transmittance. The second heat transmittance can be different from the first heat transmittance. For example, the second heat transmittance can be higher than the first heat transmittance. The areas 240 are referred to as low transmission zones that have lower heat transmittance than the circular areas 220. As such, the circular areas 220 transmit more heat than the remaining areas 240 to compensate cold spots that can be left on the workpiece supported by the support pins 210. As a result, more uniform heat is distributed to the workpiece via the support plate 200.

The present disclosure is discussed with areas 220 having a circular shape for purposes of illustration and discussion. Those of ordinary skill in the art, using the disclosures provided herein, will understand that areas 220 can have other shapes without deviating from the scope of the present disclosure.

In some embodiments, an optical transmittance of the support plate 200 is modified such that the circular areas 220 are unchanged with respect to untreated material (e.g., untreated quartz) of the rotatable base 230. The remaining areas can be treated material (e.g., treated quartz) having a reduced optical transmittance relative to the circular areas 220. The treated quartz can be treated with one or more of grinding, coating, engraving, or doping. The circular areas 220 with untreated quartz transmit a higher heating flux relative to the remaining areas 240 with treated quartz. As such, the workpiece is exposed to a higher heating flux from the circular areas 220, resulting in a compensation of cold spots caused by the support pins 210.

Figure 3:
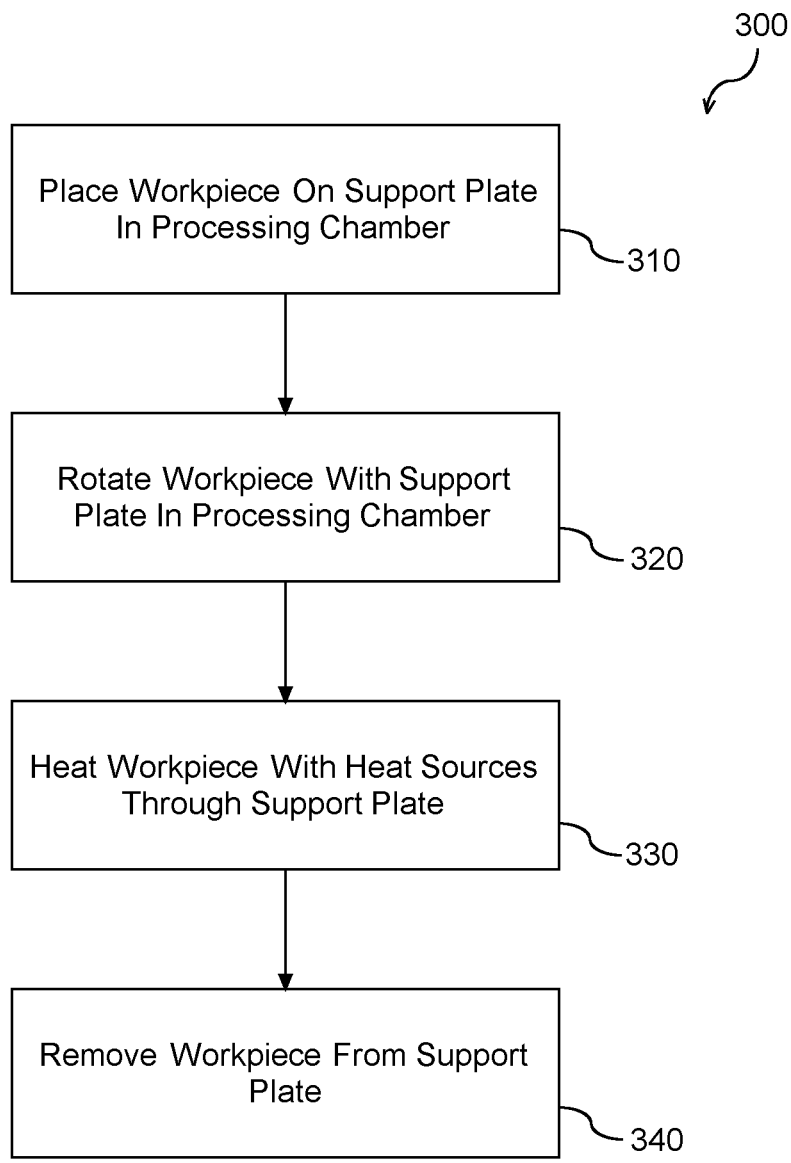
FIG. 3 depicts a flow diagram of a process for heating a workpiece through a support plate with spatially arranged low transmission zones according to example embodiments of the present disclosure.

Aspects of the present disclosure are discussed with reference to a support plate with one or more support pins as a support structure and with a rotatable base for purposes of illustration and discussion. Those of ordinary skill in the art, using the disclosures provided herein, will understand that non-rotatable bases can be used without deviating from the scope of the present disclosure. For example, a non-rotatable base can have a first portion associated with a first heat transmittance and a second portion associated with a second heat transmittance. The second heat transmittance is different from the first heat transmittance, and the second portion is located proximate to a support structure (e.g., a support pin, a ring support, etc.). Those of ordinary skill in the art, using the disclosures provided herein, will understand that any support structure (e.g., a support pin, a ring support, a support structure with an arbitrary shape, etc.) can be used without deviating from the scope of the present disclosure FIG. 3 depicts a flow diagram of a process (300) for heating a workpiece through a support plate with spatially arranged low transmission zones according to example embodiments of the present disclosure. The process (300) can be implemented using the RTP system 100 of FIG. 1. However, as will be discussed in detail below, the process (300) according to example aspects of the present disclosure can be implemented using other thermal processing systems without deviating from the scope of the present disclosure. FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (310), the process can include placing a workpiece on a support plate in a processing chamber. For example, in the embodiment of FIG. 1, the support plate 120 includes the support pins 115 and the rotatable base 135. The workpiece 110 is placed on the support pins 115 in the RTP chamber 120 via the door 180. In some embodiments, the support plate 120 can be used in an anneal processing chamber. For example, a workpiece for annealing can be placed on the support plate 120 in the anneal processing chamber. In some embodiments, the support plate 120 can include other support structures (e.g., a ring support, a support structure with an arbitrary shape, etc.). In some embodiments, the support plate 120 can include a non-rotatable base with spatially arranged low transmission zones.

At (320), the process can include rotating the workpiece with the support plate in the processing chamber. For example, in the embodiment of FIG. 1, the controller 175 instructs the rotatable base 135 to rotate the workpiece 110 in the RTP chamber 105.

At (330), the process can include heating the workpiece with a plurality of heat sources through the support plate. For example, in the embodiment of FIG. 1, the controller 175 controls the heat sources 140 to heat the workpiece 110 through the rotatable base 135 and the support bins 115 to a preset temperature.

At (340), the process can include removing the workpiece from the support plate. For example, in the embodiment of FIG. 1, the workpiece 110 can be removed from the support bins 115 to exit from the RTP chamber 105 via the door 180.

Figure 4:
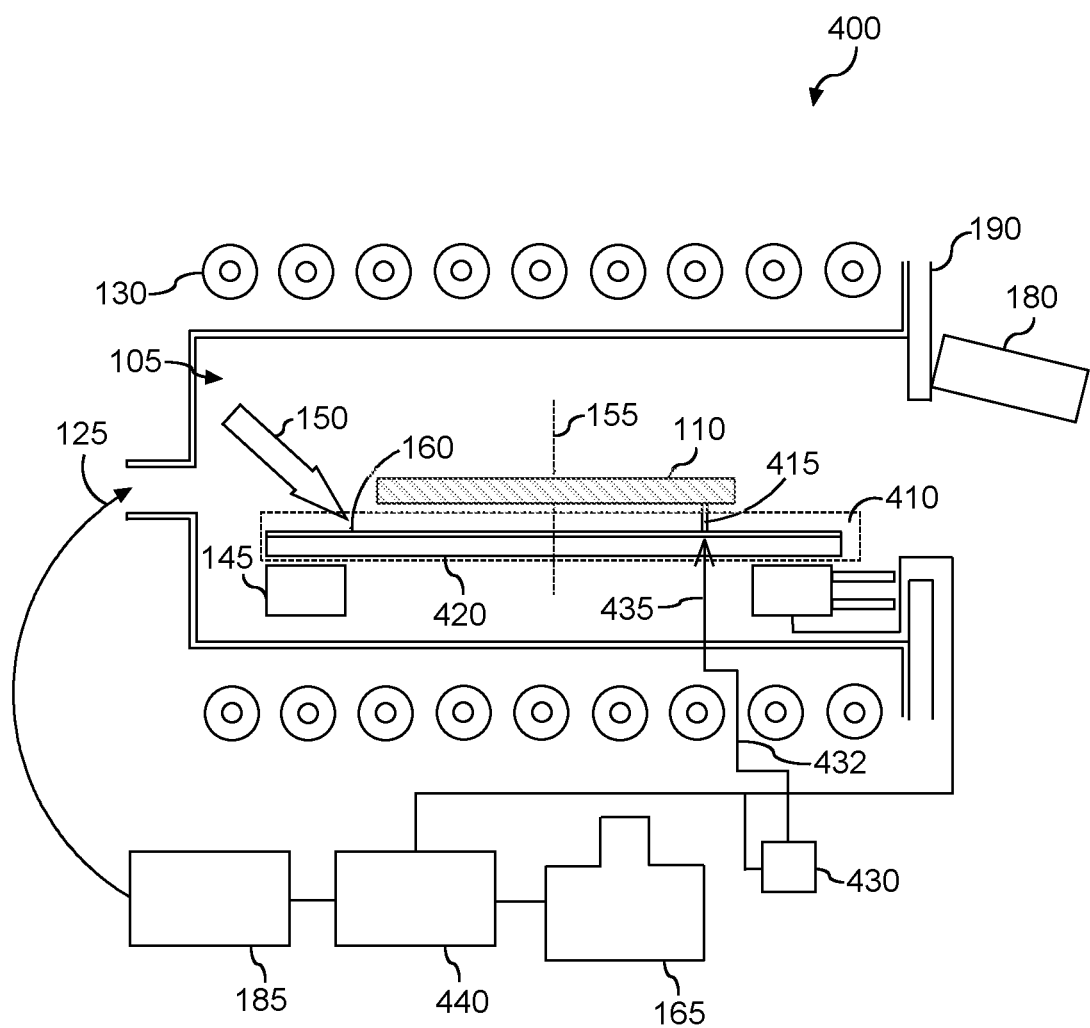
FIG. 4 depicts an example RTP system with a rotatable support plate and a coherent light source according to example embodiments of the present disclosure.

FIG. 4 depicts an example RTP system 400 with a rotatable support plate 410 and a coherent light source 430 according to example embodiments of the present disclosure. As illustrated, the RTP system 400 includes the RTP chamber 105, the workpiece 110, the rotatable support plate 410 having support pins 415 and a base 420, a coherent light source 430, a controller 440, heat sources 130 and 140, air bearings 145, the pyrometer 165, the door 180, and the gas flow controller 185.

The coherent light source 430 (e.g., a laser) can provide coherent light 435 to the chamber 105. In some embodiments, the coherent light source 430 is located external to the chamber 105 and transmits light 435 to the chamber 105 via an optical pipe or light guide 432 (e.g., fiber optic).

The rotatable support plate 410 supports the workpiece 110 during thermal processing. The rotatable support plate 410 includes a transmissive support structure and a rotatable base 415. The transmissive support structure describes a structure that contacts and supports the workpiece 110, and transmits light 435 from the coherent light source 430 (e.g., a laser) to the workpiece 110 during thermal processing. Examples of the transmissive support structure can include one or more support pins, a ring support, or any other suitable support that contacts and supports the workpiece 110, and transmits light to the workpiece 110.

The transmissive support structure includes a first end and a second end. The first end of the transmissive support plate is arranged to support the workpiece 110. The second of the transmissive support plate contacts (e.g., is coupled to) a first surface of the rotatable base 420. In the example embodiment of FIG. 1, the transmissive support structure includes one or more support pins 415 (only one shown). One end of one support pin 415 contacts a backside of the workpiece 110, and the other end of the support pin 415 contacts a surface of the base 420. The base 420 rotates the workpiece 110 at a defined rotation orientation and at a defined rotation speed based on an instruction received from the controller 440, as further described below.

In some embodiments, the transmissive support structure and the base 420 can transmit heat from the heat sources 140 and to absorb heat from the workpiece 110. For example, the transmissive support structure and the base 420 can be made of quartz.

In some embodiments, the rotatable support plate 410 includes one or more support pins 415, and the base 420 having a semi-annular opaque portion (shown in FIGS. 5 and 6) disposed between at least two of the support pins 415. The semi-annular opaque portion can obstruct coherent light of the coherent light source 430 from heating the workpiece 110 such that the coherent light source 430 can continuously emit the coherent light into onto the base 420 during the rotation of the workpiece 110.

In some embodiments, the rotatable support plate 410 includes a ring support (shown in FIG. 7) and the base 420. For example, both the ring support and the base 420 can be a transmissive material (e.g., quartz) that allows the passage of coherent light continuously emitted from the coherent light source 430 to heat the workpiece 110

The coherent light source 430 emits coherent light 435 through the rotatable base 420 and the transmissive support structure such that the coherent light heats a portion of the workpiece 110 contacting the transmissive support structure. Examples of the coherent light source 430 can include a continuous wave laser, a pulsed laser, or other suitable light source emitting coherent light.

In the example embodiment of FIG. 4, the coherent light source 430 is mounted to a stationary part of the RTP chamber 105 such that the support pin 415 is rotating through the coherent light 435 during rotation of the rotatable support plate 410. The coherent light source 430 emits coherent light 435 onto a backside of the base 420, and the emitted coherent light can pass through the support pin 415 to heat a contact area of the workpiece 110 contacting the support pin 415. As such, a cold spot resulting from contact of the workpiece 110 with the support pin 415 can be compensated by heating the workpiece 110 via the coherent light source 430 through the support pin 415 in addition to heating the workpiece 110 globally by light from the heat sources 140. In some embodiments, the coherent light source 430 is controlled by the controller 440 to be switched on and off synchronized to the workpiece 110 rotation as to heat a contact area of the workpiece in contact with the support pin 415. The controller 440 controls one or more of the rotatable base 415, the coherent light source 430, the heat sources 130 and 140, the gas flow controller 185, the door 180, and the pyrometer 165. The controller 440 controls the base 420 to rotate the workpiece 110 with a defined rotation orientation and a defined rotation speed. For example, the controller 440 generates an instruction that defines a rotation orientation and a rotation speed of the base 420, and controls the base 420 to rotate the workpiece 110 with the defined rotation orientation and the defined rotation speed. In some embodiments, the controller 440 controls the coherent light source 430 to emit coherent light 435 based on the rotation orientation and the rotation speed of the base 420. For example, the controller 440 can include an electrical control circuit that generates a trigger signal to trigger the coherent light source 430 to emit coherent light 435 based on a sensor signal indicative of a rotation orientation and a rotation speed of the base 420.

In some embodiments, the controller 440 synchronizes an emission of the coherent light from the coherent light source 430 with a motion of the base 420 such that the coherent light source 430 emits the coherent light into one of the support pins 415 and onto the workpiece 110 when that support pin 415 passes over the coherent light source 430 during rotation of the base 420, and such that the coherent light source 430 stops emitting the coherent light when that support pin 415 is not located in front of the coherent light source 430. For example, the controller 440 generates an instruction that instructs the coherent light source 430 to emit coherent light based on a rotation orientation and a rotation speed of the base 420. The instruction can include a command that instructs the coherent light source 430 to emit coherent light, a command that instructs the coherent light source 430 to stop emitting the coherent light, a command that calculates a time interval between an emission and a subsequent emission of the coherent light source 430 based on the rotation orientation and the rotation speed of the workpiece 110, etc.

In some embodiments, the controller 440 controls the coherent light source 430 to continuously emit the coherent light into the transmissive support structure. For example, the controller 440 generates an instruction that instructs the coherent light source 430 to remain on and continuously emit the coherent light onto the base 420. The base 420 can include a semi-annular opaque portion obstructing coherent light of the coherent light source 430 from heating portions the workpiece 110 not in contact with the support structure. When the support pin 415 is not located in front of the coherent light source 430, the controller 440 instructs the coherent light 430 to remain on and to continuously emit coherent light onto the semi-annular opaque portion such that the emitted coherent light is blocked by the semi-annular opaque portion. When the support pin 415 passes in front of the continuously emitted coherent light, the coherent light passes through the support pin 415 to heat the workpiece 110.

In another example, the controller 440 generates an instruction that instructs the coherent light source 430 to remain on and continuously emit the coherent light onto the rotatable support plate 410 with a ring support. During the rotation of the workpiece 110, the ring support always passes over the coherent light source 430 and transmits the coherent light to heat the workpiece 110. The controller 440 instructs the coherent light source 430 to continuously emit the coherent light into the ring support. As such, a cold pattern caused by the ring support is compensated by continuously shining the coherent light from the coherent light source 430 through the ring support onto workpiece 110.

Figure 5:
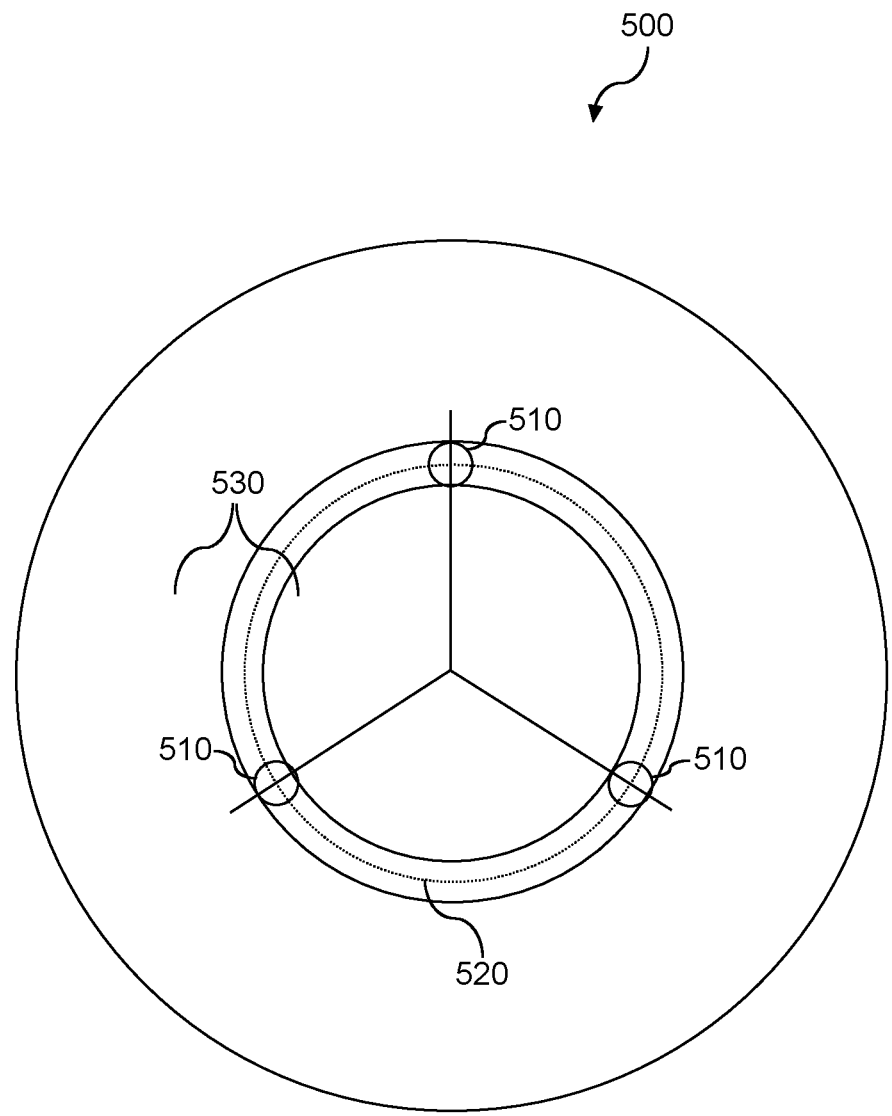
FIG. 5 depicts an example base with spatially arranged low transmission zones according to example embodiments of the present disclosure.

FIG. 5 depicts an example base 500 with spatially arranged low transmission zones according to example embodiments of the present disclosure. In the embodiment of FIG. 5, the base 500 can be an embodiment of the base 420. The base 500 includes three round-shape portions 510, multiple semi-annular opaque portions 520, and remaining portions 530. One round-shape portion 510 is a contact area of a workpiece contacting a support pin (not shown). Each semi-annular opaque portion is disposed between any two of the three round-shape portions 510. The remaining portions 530 of the base 500 describe portions that exclude the three round-shape portions 510 and multiple semi-annular opaque portions 520 within the base 500.

Figure 6:
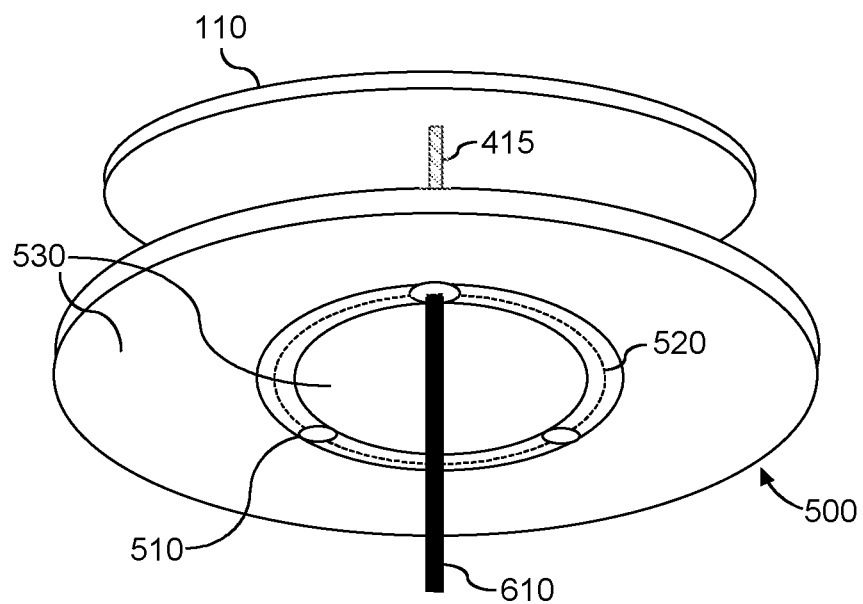
FIG. 6 depicts an example of coherent light heating a workpiece through a rotatable support plate with spatially arranged low transmission zones according to example embodiments of the present disclosure.

FIG. 6 depicts an example of coherent light 610 heating the workpiece 110 through the base 500 and the support pin 415 according to example embodiments of the present disclosure. The coherent light 610 is emitted from a coherent light source (not shown). The coherent light 610 passes through the support pin 415 to heat the workpiece 110. When the base 500 rotates, the support pin 415 is not located in front of the coherent light 610, but one semi-annular opaque portion 520 passes over the coherent light 610 and obstructs the coherent light 610 to heat the workpiece 110. As such, cold spots are compensated by shining a continuously emitting coherent light onto each support pin during the rotation of the base 500.

In the embodiment of FIGS. 5 and 6, a width of the semi-annular opaque portion 520 is not less than a diameter of a contact area of the coherent light 610 in contact with the base 500. Examples of the contract area of the coherent light 610 include a focal point of the coherent light 610 onto the base 500, or a cross-section of the coherent light 610 contacting the base 500. The round-shape portions 510 and the remaining portions 530 can be unchanged with respect to untreated material (e.g., untreated quartz) of the base 500. The semi-annular opaque portions 520 can be treated material (e.g., treated quartz) that obstructs coherent light of a coherent light source (not shown) from heating the workpiece 110. The treated material can be treated with one or more of grinding, coating, engraving, or doping. In some embodiments, the semi-annular opaque portions 520 includes a wavelength selective coating on one side (e.g., a backside) or both sides of the base 500. The wavelength sensitive coating is selected such that only a narrow band of the coherent light radiation is blocked, whereas a broad band light from the heat sources is almost completely transmitted, reducing an effect on a global temperature uniformity.

In some embodiments, the semi-annular opaque portions 520 can extend between support pins 415 along a path of coherent light 610 along the base 500 during rotation of the base 500 relative to a coherent light source (not shown). The semi-annular opaque portions 520 can be small as to not obstruct light from heat sources (not shown). The semi-annular opaque portions 520 are also referred to low transmission zones that obstruct coherent light to heat a workpiece.

Aspects of the present disclosure are discussed with reference to a rotatable support plate with three support pins as transmissive support structures for purposes of illustration and discussion. Those of ordinary skill in the art, using the disclosures provided herein, will understand that multiple disconnected supports with a rotatable symmetric arrangement can be used without deviating from the scope of the present disclosure. For example, multiple supports are not connected with each other, but these multiple supports are arranged in rotatable symmetric pattern on the base. A support can have an arbitrary shape.

Figure 7:
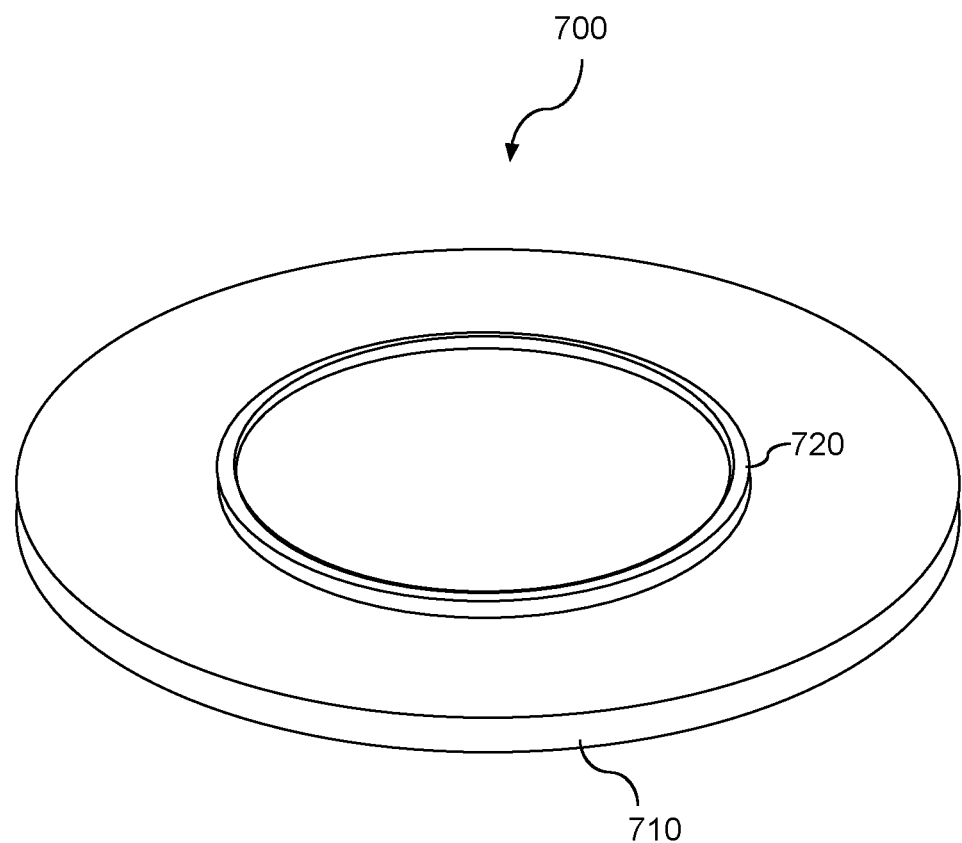
FIG. 7 depicts an example rotatable support plate with a ring support according to example embodiments of the present disclosure.

FIG. 7 depicts an example rotatable support plate 700 with a ring support 720 according to example embodiments of the present disclosure. In the embodiment of FIG. 7, the rotatable support 700 can be an embodiment of the rotatable support plate 410. The rotatable support 700 includes a rotatable base 710 and the ring support 720. The ring support 720 is centered with respect to a center of the rotatable base 710. In some embodiments, the ring support 720 is centered with respect to a center of a workpiece (not shown) contacting the ring support 720. A width of the ring support 720 is not less than a diameter of a contact area of the coherent light (not shown) in contact with the ring support 720. Examples of the contact area of the coherent light include a focal point of the coherent light onto the ring support 720, or a cross-section of the coherent light contacting the ring support 720. In some embodiments, a height of the ring support 710 can be approximately the same as a height of the support pin 415. In some embodiments, both the rotatable base 710 and the ring support 720 can be a transmissive material (e.g., untreated quartz) that allows the passage of coherent light from a coherent light source to heat a workpiece. As such, a coherent light source can continuously emit coherent light that passes through the rotatable base 710 and the ring support 720 to heat a workpiece contacting the ring support 720. Additionally, a cold pattern caused by the ring support 720 can be compensated by a continuously emission from the coherent light source to heat the workpiece.

Aspects of the present disclosure are discussed with reference to a rotatable support plate with a ring support as a transmissive support structure for purposes of illustration and discussion. Those of ordinary skill in the art, using the disclosures provided herein, will understand that any transmissive support structure with a rotatable symmetric shape can be used without deviating from the scope of the present disclosure.

Figure 8:
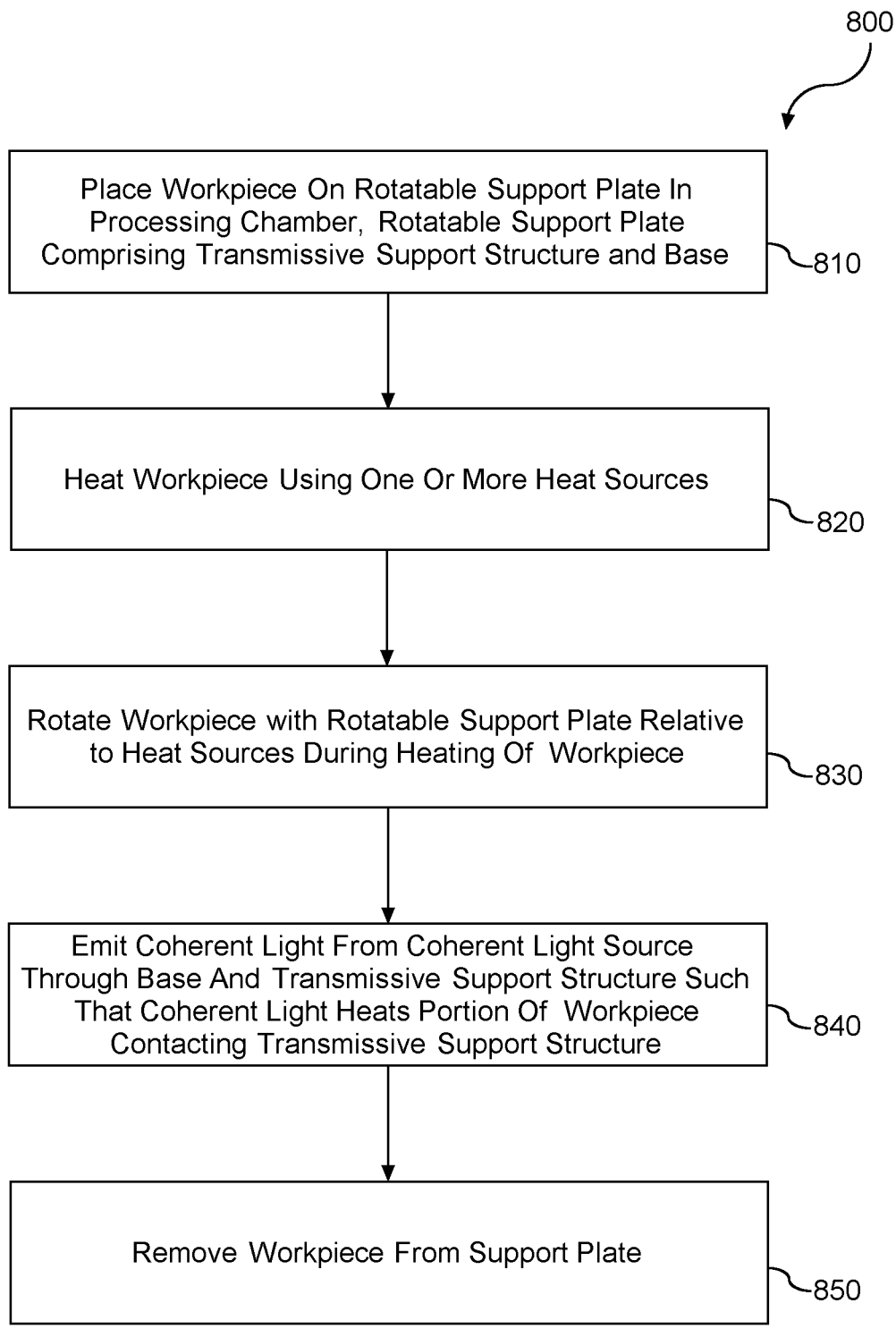
FIG. 8 depicts a flow diagram of a process for heating a workpiece based on a rotatable support plate and a coherent light source according to example embodiments of the present disclosure.

FIG. 8 depicts a flow diagram of a process (800) for heating a workpiece based on a rotatable support plate and a coherent light source according to example embodiments of the present disclosure. The process (800) can be implemented using the RTP system 400. However, as will be discussed in detail below, the process (800) according to example aspects of the present disclosure can be implemented using other thermal processing systems without deviating from the scope of the present disclosure. FIG. 8 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (810), the process can include placing a workpiece on a rotatable support plate in a processing chamber. The rotatable support plate includes a transmissive support structure and a base. For example, in the embodiment of FIG. 4, the rotatable support plate 410 includes support pins 415 and the base 420. The workpiece 110 is placed on the support pins 415 in the RTP chamber 105 through the door 180. In some embodiments, the rotatable support plate 410 can be used in an anneal processing chamber. For example, a workpiece for annealing can be placed on the rotatable support plate 410 in the anneal processing chamber.

At (820), the process can include heating the workpiece using one or more heat sources. For example, in the embodiment of FIG. 4, the controller 440 controls the heat sources 140 to heat the workpiece 110 through the base 420 and the support bins 415 to a preset temperature.

At (830), the process can include rotating the workpiece with the rotatable support plate relative to the one or more heat sources during heating of the workpiece. For example, in the embodiment of FIG. 4, the controller 440 instructs the base 420 to rotate the workpiece 110 in the RTP chamber 105 with a defined rotation orientation and a defined rotation speed.

At (840), the process can include emitting coherent light from a coherent light source through the base and the transmissive support structure such that the coherent light heats a portion of the workpiece contacting the transmissive support structure. For example, in the embodiment of FIG. 4, the controller 440 synchronizes an emission of the coherent light from the coherent light source 430 with a motion of the base 420 such that the coherent light source 430 emits the coherent light into one of the support pins 415 and onto the workpiece 110 when that support pin 415 passes over the coherent light source 430 during rotation of the base 420, and such that the coherent light source 430 stops emitting the coherent light when that support pin 415 is not located in front of the coherent light source 430. In another example, the controller 440 controls the coherent light source 430 to continuously emit the coherent light to heat workpiece 110 through the rotatable support plate 410 (e.g., a rotatable support plate with support pins 415 and the base 500 in FIGS. 5 and 6, or the rotatable support plate 700 in FIG. 7).

At (850), the process can include removing the workpiece from the rotatable support plate. For example, in the embodiment of FIG. 4, the workpiece 110 can be removed from the support bins 415 to exit from the RTP chamber 105 via the door 180.

Aspects of the present disclosure are discussed with reference to a rotatable support plate. Those of ordinary skill in the art, using the disclosures provided herein, will understand that example aspects of the present disclosure can be implemented with a stationary support plate. For instance, one or more coherent light sources can be positioned in view of a support pin on the stationary support plate. The coherent light source can emit coherent light onto the stationary support plate and through the support pin for cold spot reduction on the workpiece.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A thermal processing apparatus, comprising:
   a plurality of heat sources configured to heat a workpiece;
   a rotatable support plate operable to support the workpiece during thermal processing, the rotatable support plate comprising:
   a transmissive support structure configured to contact the workpiece, the transmissive support structure comprising a first end and a second end, wherein the first end of the transmissive support structure is arranged to support the workpiece; and
   a light source operable to emit coherent light through the transmissive support structure such that the coherent light heats a portion of the workpiece contacting the transmissive support structure,
   wherein the rotatable support plate comprises a base, the base having semi-annular opaque portions of treated material that are each disposed between transmissive portions of untreated material, wherein one of the transmissive portions of untreated material contacts the second end of the transmissive support structure, wherein the semi-annular opaque portions of treated material are configured to obstruct the coherent light of the light source from heating the workpiece, and wherein the transmissive portions of untreated material are configured to transmit the coherent light of the light source to the transmissive support structure.

2. The thermal processing apparatus of claim 1, wherein the transmissive support structure is configured to transmit heat from the plurality of heat sources to the workpiece.

3. The thermal processing apparatus of claim 1, wherein the transmissive support structure comprises a quartz material.

4. The thermal processing apparatus of claim 1, wherein the light source is configured to be maintained stationary relative to the rotatable support plate during rotation of the rotatable support plate during thermal processing of the workpiece.

5. The thermal processing apparatus of claim 1, wherein the light source comprises a laser.

6. The thermal processing apparatus of claim 1, wherein the transmissive support structure comprises a plurality of support pins.

7. The thermal processing apparatus of claim 6, wherein the semi-annular opaque portions of treated material are each disposed between at least two of the plurality of support pins.

8. The thermal processing apparatus of claim 1, wherein a width of each of the semi-annular opaque portions of treated material is not less than a diameter of a contact area of the coherent light in contact with the base.

9. The thermal processing apparatus of claim 1, wherein each of the semi-annular opaque portions of treated material comprises a wavelength selective coating on a surface of the base.

10. The thermal processing apparatus of claim 1, further comprising a controller configured to synchronize an emission of the coherent light from the light source with a motion of the base such that the light source emits the coherent light into the transmissive support structure and onto the workpiece when the transmissive support structure passes over the light source during rotation of the rotatable support plate, and such that the light source stops emitting the coherent light when the transmissive support structure is not located in front of the light source.

* * * * *